United States Patent
Kondo et al.

(10) Patent No.: US 6,521,139 B1
(45) Date of Patent: Feb. 18, 2003

(54) COMPOSITION FOR CIRCUIT BOARD MANUFACTURE

(75) Inventors: Masaki Kondo, Toyosaka (JP); Joseph R. Montano, Boston, MA (US)

(73) Assignee: Shipley Company L.L.C., Marlborough, MA (US)

( * ) Notice: Subject to any disclaimer, the term of this patent is extended or adjusted under 35 U.S.C. 154(b) by 178 days.

(21) Appl. No.: 09/632,736

(22) Filed: Aug. 4, 2000

(51) Int. Cl.⁷ .................................................. C23F 1/00
(52) U.S. Cl. ........................ 216/108; 216/13; 216/34; 216/20; 156/20
(58) Field of Search ............................. 216/34, 13, 20, 216/108; 428/607; 156/20

(56) References Cited

U.S. PATENT DOCUMENTS

| | | | |
|---|---|---|---|
| 2,932,599 A | | 4/1960 | Dahlgren |
| 3,895,170 A | | 7/1975 | Tanaka et al. |
| 3,948,703 A | * | 4/1976 | Kushibe ...................... 156/20 |
| 4,409,037 A | | 10/1983 | Landau |
| 4,428,987 A | * | 1/1984 | Bell et al. ...................... 156/20 |
| 4,512,818 A | | 4/1985 | Valayil et al. |
| 4,642,161 A | | 2/1987 | Akahoshi et al. |
| 5,106,454 A | | 4/1992 | Allardyce et al. |
| 5,403,672 A | * | 4/1995 | Urasaki et al. ............. 428/617 |
| 5,800,859 A | | 9/1998 | Price et al. |
| 5,802,714 A | * | 9/1998 | Kobayashi et al. ........... 216/17 |
| 5,869,130 A | * | 2/1999 | Ferrier ........................ 427/98 |
| 5,900,256 A | | 5/1999 | Scoville et al. |
| 6,054,061 A | | 4/2000 | Bayes et al. |
| 6,162,503 A | | 12/2000 | Ferrier ....................... 427/327 |

FOREIGN PATENT DOCUMENTS

| | | |
|---|---|---|
| EP | 0 887 439 A | 12/1998 |
| EP | 0 890 660 A | 1/1999 |
| GB | 2 133 783 A | 8/1984 |
| JP | 2000-64067 | 2/2000 |
| WO | WO 96/19097 | 6/1996 |
| WO | WO 01/49805 A1 | 7/2001 |

OTHER PUBLICATIONS

Derwent Info Ltd., Patent Abstract of Japanese Patent No. 51027819. Apr. 22, 1976.
Derwent Info Ltd., Patent Abstract of Japanese Patent No. 3079778. Jan. 22, 1967.
Derwent Info Ltd., Patent Abstract of Japanese Patent No. 6112646. Jul. 15, 1994.
Chem. Abstract 128: 175092 Apr. 16, 1998.
Chem. Abstract 115: 40197 Jul. 29, 1991.
Abstract of European Publication No. 0 890 660; Publication Date: Jan. 13, 1999.
Abstract of European Publication No. 0 893 947; Publication Date: Jan. 27, 1999.
Abstract of U.S. Patent No. 5,869,130; Grant Date: Feb. 9, 1999.
Japanese Unexamined Patent Application No. Hei 3–79778, Application Date: Aug. 21, 1989; Japanese Patent Office Official Gazette for Unexamined Patent Applications.

* cited by examiner

Primary Examiner—Randy Gulakowski
Assistant Examiner—Gentle E. Winter
(74) Attorney, Agent, or Firm—S. Matthew Cairns

(57) ABSTRACT

A process and composition for treating a metal surface to increase its surface roughness for subsequent adhesion to a polymer layer are disclosed. The composition includes hydrogen peroxide, inorganic acid, at least two corrosion inhibitors.

17 Claims, No Drawings

COMPOSITION FOR CIRCUIT BOARD MANUFACTURE

BACKGROUND OF THE INVENTION

1. Field of the Invention

This invention relates to a process for the manufacture of multilayer printed circuit boards. In particular, this invention relates to a novel composition for treatment of copper and its alloys to form a surface having a uniformly etched and conversion coated surface with desirable properties for lamination of circuit layers and liquid polymer coating in multilayer circuit fabrication.

2. Description of the Prior Art

Multilayer printed circuit boards are used for a variety of electrical applications and provide the advantage of conservation of weight and space. A multilayer board is comprised of two or more circuit layers, each circuit layer separated from another by one or more layers of dielectric material. Circuit layers are formed by applying a copper layer onto a polymeric substrate. Printed circuits are then formed on the copper layers by techniques well known to the art, for example print and etch to define and produce the circuit traces—i.e., discrete circuit lines in a desired circuit pattern. Once the circuit patterns are formed, a stack is formed comprising multiple circuit layers separated from each other by a dielectric layer, typically epoxy. Once the stack is formed, it is subjected to heat and pressure to form the laminated multilayer circuit board.

Following lamination, the multiple circuit layers are electrically connected to each other by drilling through holes through the board surface. Resin smear from through-hole drilling is removed under rather stringent conditions, for example, by treatment with a concentrated sulfuric acid or hot alkaline permanganate solution. Thereafter, the through-holes are further processed and plated to provide a conductive interconnecting surface.

Prior to lamination and through hole formation, the discrete copper circuit lines are typically treated with an adhesion promoter to improve bond strength between each circuit layer and adjacent interleaving dielectric resin layers. One method used by the art to improve bond strength involves oxidative treatment of the copper circuit lines to form a copper oxide surface coating on the circuit lines. The oxide coating is usually a black or brown oxide layer that adheres well to the copper. The oxide possesses significantly more texture or roughness than an untreated copper surface. Chemical treatments which produce adherent conversion coatings on metal surfaces, such as black oxide, are very commonly used as to promote adhesion of organic materials to metals. Other examples include metal phosphate coatings used as paint adhesion promoters. Such roughened and conversion coated surfaces enhance adhesion and wettability to the adjacent insulating layer by a mechanism that is believed to include mechanical interlocking between the metal surface and a dielectric resin layer. Metal surfaces that have been microetched, but not conversion coated do not generally possess as high a degree of surface roughness and texture, as can be inferred from their greater reflection of visible light.

Oxide layers are most often formed using highly alkaline solutions containing an oxidizing agent, typically sodium chlorite as disclosed in U.S. Pat. Nos. 2,932,599 and 4,844,981.

As described above, following formation of a multilayer stack, metallized through holes are formed to provide electrical connections between circuit layers. The formation of the metallized holes involves treatment with acidic materials. The acidic materials have a tendency to dissolve the copper oxide on the circuit lines where exposed in a through hole, interfering with bond between the circuit lines and the dielectric resin material and often causing a condition known in the art as pink ring. To reduce the susceptibility of the oxide to such attack, the oxide treatment described above is often followed by a step of converting the copper oxide to a form less soluble in acid while retaining enhanced surface roughness. Exemplary processes include reduction of the oxide by treatment with a reducing solution such as dimethylamine borane as shown in U.S. Pat. No. 4,462,161, an acid solution of selenium dioxide as shown in U.S. Pat. No. 4,717,439, or a sodium thiosulfate solution as shown in U.S. Pat. No. 5,492,595. An alternative approach involves partial or complete dissolution of the oxide layer to provide a copper surface having enhanced texture as shown in U.S. Pat. No. 5,106,454.

Other techniques known in the art to promote adhesion between copper surfaces and dielectric resins prior to multilayer lamination include the use of etches inclusive of cupric chloride etchants, mechanical treatments designed to produce surface texture, and metal plating, all designed to produce roughened surfaces. Historically, mechanical treatment and chemical etching procedures have not generally found wide acceptance in the industry, most likely due to deficiencies in both process consistency and in the bond strength to the dielectric material. Electrolytic metal plating processes may provide highly roughened surfaces and are commonly used to enhance adhesion of continuous sheets of copper to epoxy for formation of copper circuit board laminates. However, the innerlayers of a printed circuit board contain many electrically discrete circuit traces which prevent use of a process requiring electrical connection to all areas to be plated.

Oxidizing solutions containing peroxide are well known in the art. Such solutions have been used for a variety of purposes including removal of oxide scale, cleaning of surfaces, creation of smoother, brighter metallic surfaces and creation of microroughened metal surfaces. For example, in Canadian Patent Application A-1250406, metals such as iron, copper or their alloys are treated using a solution comprising hydrogen peroxide for metal pickling or polishing. The hydrogen peroxide solution contains a stabilizer, optionally a corrosion inhibitor such as benzotriazole, and an anionic or non-ionic surfactant. Because hydrogen peroxide decomposition is a problem, many hydrogen peroxide based compositions have been developed, each comprising a different type of stabilizing system.

Cleaning or polishing compositions based on hydrogen peroxide are described, for example, in U.S. Pat. No. 3,556,883 which discloses compositions comprising hydrogen peroxide, sulfuric acid and alcohol stabilizers for cleaning of, for example, metal wires. Other similar cleaning compositions are described in U.S. Pat. No. 3,756,957 where a stabilizer for hydrogen peroxide is selected from the group of aliphatic amines and their salts, alkoxy amines, aliphatic acid amines and aliphatic amines.

For use in the printed circuit industry, hydrogen peroxide etching solutions are known and have been described as etchant compositions for use in an etching step for forming a copper circuit pattern from copper laminate mounted on an insulating layer protected in a pattern corresponding to a final desired circuit pattern. The foil is then contacted with the etching solution and the unprotected copper leaves the desired circuit pattern. During the etching processes, the copper foil contacted with the hydrogen peroxide-based composition is etched away for complete removal. Peroxide etchants are described, for example, in U.S. Pat. Nos. 4,144,119; 4,437,931; 3,668,131; 4,849,124; 4,130,454; 4,859,281 and 3,773,577. In the latter two references, the etching composition also comprises a triazole to increase etch rate.

In U.K. Patent No. 2,203,387, a copper etching process is described with an etch bath regeneration step. A hydrogen peroxide etching composition comprising stabilizers including wetting agents is disclosed for cleaning copper surfaces of a printed circuit board prior to electroplating an additional copper layer onto the conducting layer which is formed from copper. After the electroplating step, a photoresist or screen resist is applied.

In U.S. Pat. No. 4,051,057, a bright dip composition for polishing/pickling metal surfaces, for instance of copper, comprises sulfuric acid, a hydroxy acid, such as citric acid, hydrogen peroxide, a triazole and/or a tertiary fatty-amine. The incorporation of surfactant is said to increase the rate of etching and oxide removal from the surface and the incorporation of benzotriazole is said to improve the "leveling effect".

In U.S. Pat. No. 3,948,703, chemical copper polishing compositions are described containing hydrogen peroxide, an acid and an azole compound. The compositions may also contain a surfactant and nonionic surfactants are used in the working examples.

In U.S. Pat. No. 4,956,035, chemical polishing compositions for metal surfaces comprise an etching composition, such as ferric chloride or peroxy sulfuric acid with a quaternary ammonium cationic surfactant and a secondary surfactant.

In U.K. Patent No. 2,106,086, hydrogen peroxide/acid compositions are used to etch, chemically mill or bright dip copper surfaces. The compositions contain triazole compounds to stabilize them against decomposition by heavy metal ions.

In Japanese published application No. 06-112,646, a copper surface is roughened to improve adhesion in laminates for the production of multilayer printed circuit boards. The roughening is carried out a by two-step process, each step involving treatment with a hydrogen peroxide/sulfuric acid composition. Both compositions must be free of a corrosion inhibitor.

In Japanese applications Nos. 03-140481 to 03-140484, copper surfaces are pretreated prior to lamination with a hydrogen peroxide/sulfuric acid composition to form a roughened surface. In 03-140484, the composition contains an additive (CB-596) manufactured by the Xekki Co., which is said to accelerate the process and inhibit decomposition of peroxide.

In U.S. Pat. No. 3,773,577, a copper etchant based on sulfuric acid and hydrogen peroxide contains an aliphatic amine, examples being primary or tertiary amines. The amines are not surface active. In Japanese application 03-79, 778 a copper etchant based on sulfuric acid and hydrogen peroxide contains a triazole and chloride ion together with an alcohol or glycol. In Japanese application No. 51-27,819 a copper etchant based on hydrogen peroxide and sulfuric acid contains a tetrarole and optionally a tertiary amine or an alcohol.

In PCT application Publication No. WO 96/19097 published Jun. 20, 1996, it is reported that a hydrogen peroxide containing aqueous composition used on a copper surface forms a cleaned copper surface which is both micro-roughened and conversion coated so as to have sufficiently good porosity that enables a strong bond to form with an organic layer as required in the preparation of multilayer boards. In accordance with the publication, it is disclosed that a process is provided for treating a metal surface comprising contacting the conducting layer of a circuit with an adhesion promotion composition comprising 0.1 to 20% by weight hydrogen peroxide, an inorganic acid, an organic corrosion inhibitor and a surfactant in an adhesion promotion step to form a micro-roughened conversion-coated surface. It is stated that the process is particularly useful for forming multilayer printed circuit boards comprising an innerlayer and an outerlayer, the innerlayer comprising at least one insulating layer and at least one conducting layer and the outerlayer comprising at least an insulating layer, in which the conducting layer is the metal surface treated with the peroxide composition. After the adhesion promotion, a polymeric material is adhered directly to the conducting layer of the innerlayer. The polymeric material may be the insulating layer of the outerlayer or for direct adhesion to the insulating layer of the outerlayer. It is further stated that the process may be used to provide a roughened surface to which polymeric materials such as photoimageable resins, solder masks, adhesives or polymeric etch resists have improved adhesion, usually in the manufacture of printed circuit boards. Finally, it is stated that the process is advantageous as it overcomes the need for forming a black or brown copper oxide layer, as in prior art processes.

In Japanese published patent application No. 11-315381, a process is disclosed for treating a metal surface in an adhesion promotion step to form a roughened conversion coated surface comprising contacting the conducting layer of the surface with an adhesion promoting composition. Said composition comprising 0.1 to 20% by weight hydrogen peroxide, one or more inorganic acids, an amine or quaternary ammonium compound, each free of a surfactant substituent and a corrosion inhibitor, and optionally comprising a corrosion inhibitor. The treatment composition disclosed in this patent application is similar to the composition of PCT Application No. WO 96/19097 referenced above, but is an improvement by replacement of the surfactant of the application with the non-surfactant amine or quaternary ammonium compound. Formulations containing surfactants are often difficult to use in the spray mode because of excessive foaming of the solution. Rinsing of the surfactant from the coating is often difficult because a surfactant often adheres to a surface. If surfactant is left on the surface, it may interfere with bond strength between the oxide coating and the surface adhered to the coating.

Japanese published patent application No. 2000-64067, discloses an etching solution useful for a roughening treatment of a copper surface comprising oxiso acid, a peroxide and corrosion inhibitor comprising 1,2,3-type azole compound. It is disclosed in this patent application that the etching solution has an etching rate (i.e., dissolution rate of copper) that is not affected by the concentration of halogen ion due to the included tetrazole or 1,2,3-type azole compound. Although it is disclosed that the composition comprises two corrosion inhibitors, hydroxy-substituted azole compounds are not disclosed. Also, this application discloses the stability of the etching rate and the formation of the etched copper surface. However, the bond strength between the etched or roughened surface and the subsequently adhered coating is not disclosed.

There is thus a continuing need for compositions that provide effective etched or roughened copper surfaces while also providing increased bond strength with subsequently applied coatings.

SUMMARY OF THE INVENTION

The adhesion promoting compositions of the present invention provide excellent conversion coatings that have increased peel strengths as compared with known adhesion promoting compositions. Such adhesion promoting compositions are free of amines having surfactant functionality. Conversion coatings of various thicknesses may be obtained according to the present invention depending upon the particular inorganic acid used and its amount in the adhesion promotion composition. The bond strength between the conversion coating and the subsequently applied coating may be further improved by the addition of halide ion to the present compositions.

In accordance with the present invention, there is provided a process for treating a metal surface in an adhesion promotion step to form a microroughened conversion coated surface comprising contacting the conducting layer of the surface with an adhesion promotion composition comprising (1) hydrogen peroxide, (2) one or more inorganic acids, and (3) at least two corrosion inhibitors comprising at least one hydroxy-substituted azole compound.

The present invention also provides an adhesion promoting composition comprising hydrogen peroxide, one or more inorganic acids, and at least two corrosion inhibitors comprising at least one hydroxy-substituted azole compound.

DETAILED DESCRIPTION OF THE INVENTION

The adhesion promotion composition of the invention comprises (1) hydrogen peroxide, (2) one or more inorganic acids, and (3) at least two corrosion inhibitors comprising at least one hydroxy-substituted azole compound. The use of such composition results in the formation of a microroughened conversion coated surface. While not intending to be bound by theory, it is believed that the conversion coated surface is composed of an insoluble complex of copper. The microroughened surface provides substantial surface area that promotes good adhesion to subsequently applied organic coatings.

In the adhesion promoting baths of the present invention, the hydrogen peroxide may be used in any concentration. If the concentration of hydrogen peroxide in the adhesion promoting composition is too high, the appearance and uniformity of the surface film are degraded. The hydrogen peroxide is typically present in an amount of at least 0.01%, by weight based on the total weight of the bath. In general, hydrogen peroxide is present from 0.1 to 20% by weight, preferably from 0.5% to 10%, and more preferably from 1% to 5%. Typically, hydrogen peroxide is generally commercially available as 35% by weight in water.

The compositions of the present invention may optionally comprise a stabilizing agent for hydrogen peroxide. Suitable stabilizing agents may be those mentioned in the patents above. Examples include, but are not limited to, dipicolinic acid, diglycolic and thiodiglycolic acid, ethylene diamine tetraacetic acid and its derivatives, magnesium salts of an aminopolycarboxylic acid, sodium silicate, phosphonates and sulphonates.

When the compositions include a stabilizing agent, the stabilizing agent is desirably present in an amount of form 0.001% and preferably at least 0.005% by weight of the adhesion promotion composition. More preferably, the concentration of the stabilizing agent varies between 0.5 and 5% by weight of the composition.

The inorganic acid useful in the present invention may be a single acid or a mixture of acids. The total amount of inorganic acid in the baths of the present invention is typically from 1 to 30%, by weight based on the weight of the bath. It is preferred that the weight of the inorganic acid is from 5% to 20% by weight. A variety or inorganic acids are suitable, including ,but not limited to, sulfuric acid, nitric acid, hydrochloric acid, phosphoric acid and mixtures thereof. It is preferred that the inorganic acid is sulfuric acid, phosphoric acid or a mixture of sulfuric acid and phosphoric acid. When a mixture of inorganic acids is used, the acids may be combined in any ratio, typically in a ratio of from 99:1 to 1:99, and preferably from 75:25 to 25:75. When a mixture of sulfuric acid and phosphoric acid is used, it is preferred that such mixture has a major amount of sulfuric acid and a minor amount of phosphoric acid. The inorganic acids suitable for use in the present invention are generally commercially available and may be used without further purification. It has been found that the present compositions result in the formation of coatings that are darker in color than those available from conventional adhesion promoting baths. Such darker color indicates the formation of a thicker coating. The thicker coating provides a more uniform surface treatment which is likely to be more tolerant of subsequent handling.

In the present invention, mixture of at least two corrosion inhibitors is used, wherein at least one of the corrosion inhibitors is a hydroxy-substituted azole compound. The hydroxy-substituted azole compounds of the present invention may have more than one hydroxy substituent and may be further substituted, such as with a $(C_1-C_6)$alkyl, $(C_1-C_6)$ alkoxy, halogen, aid the like. Suitable hydroxy-substituted azole compounds include, but are not limited to, hydroxy-substituted triazoles and hydroxy-substituted tetrazoles. 1-Hydroxybenzotriazole is preferred. Any corrosion inhibitor may be used as the second corrosion inhibitor in combination with the hydroxy-substituted azole compound, provided that the second corrosion inhibitor is compatible with the adhesion promoting composition. For example, the second corrosion inhibitor may include, but not limited to, triazoles, tetrazoles, imidazoles or mixtures thereof. Suitable second corrosion inhibitors include, but are not limited to, benzotriazoles such as benzotriazole, carboxybenxzotriazole, dilorobenzotriazole and mixtures thereof. Preferably, the second corrosion inhibitor is benzotriazole. It is more preferred in this invention that the mixture of corrosion inhibitors is benzotriazole and 1-hydroxybenzotriazole. The corrosion inhibitors are available from a variety of commercial sources and may be used without further purification.

The corrosion inhibitors are used in the present invention in a wide range of amounts, typically from 0.1 to 2% by weight based on the total weight of the bath, and preferably from 0.2 to 1% by weight more preferably form 0.3 to 0.6% by weight. Such amounts are for the total amount of corrosion inhibitors in the present compositions, The at least two corrosion inhibitors may be combined in any ratio. Typically, the ratio of corrosion inhibitors is in the range of from 99:1 to 1:99, preferably from 90:10 to 10:90, and more preferably from 75:25 to 25:75.

The copper adhesion promoting baths of the present invention may optionally contain halide ions, preferably chloride ions. Adding such ions provides improving the bond strength between the oxide coating and the surface adhered to the coating. When such halide ions are used, they are typically present in an amount of from 1 to 50 ppm. When the halide ion is chloride, it is preferred that the chloride is present in an amount up to 8 ppm. It is more preferably from 4 to 7 ppm. Any of a variety of halide sources may be used, preferably, halide sources that are free of surfactant groups, such as tetraalkyl ammonium halides. Preferred tetrtaakyl ammonium halides include tetramethyl ammonium chloride, tetabutyl ammonium chloride and mixtures thereof.

The compositions of the present invention are preferably free of surfactant and more preferably free of quaternary ammonium surfactants.

It will be appreciated by those skilled in the art that one or more additional components may be added to the present compositions. Whether such additional components are used will depend upon the particular bath composition and process conditions used.

The baths of the present invention are typically heated. Typically, the temperature of the bath is 75° C. or lower, and preferably in the range of from 20° to 50° C.

For adhesion promotion, the copper may contact the baths of the present invention by any conventional means, such as by immersion in the bath or by spraying the bath on the copper surface.

The adhesion promotion composition of the invention may be prepared by mixing the components in an aqueous solution, preferably formed using deionized water. In accordance with standard safe practices, hydrogen peroxide is desirably added to the composition in a diluted form. The components forming the adhesion promotion composition are mixed as required.

In use of the present compositions, a metal surface particularly copper, or a copper alloy surface, is cleaned by mechanical or chemical cleaning and then contacted with the adhesion promoter. The metal surface may have previously been provided with a tarnish-inhibiting coating e.g. by incorporating the tarnish inhibitor into a resist stripping composition used in an immediately preceding step of etch resist stripping. Tarnish inhibitors used in such strippers are, for example a triazole or other coating. If so, it may be desirable to pre-clean the copper surface with a pre-cleaner before contact with the oxide forming composition. In a preferred embodiment of the invention, the adhesion promotion step follows an etch resist stripping step or there is a single pre-cleaning step between the etch resist stripping step and the adhesion promotion step.

Contact with the adhesion promotion composition may be by any conventional means, for example, by immersion in a bath of the adhesion promotion composition or by spraying or any other means of contact, Contact may be as part of a continuous process. The treatment is at a temperature desirably not exceeding 75° C. and more preferably, at a temperature varying between 20° C. and 50° C. Contact time is at least 1 second and preferably between 5 seconds and 2 minutes though the maximum contact time may be up to 10 minutes. A contact time of about 1 minute or less is particularly preferred.

The process can be used to replace the conventional black copper oxide adhesion promotion step in a considerably reduced number of steps. The micro-roughened and conversion coated surface which is formed according to the present invention provides good adhesion to an adjacent polymeric coating, for example, an epoxy bonded fiber glass resin of an adjacent insulating resist layer. The invention has been found to be particularly advantageous when the treated copper is a foil produced in a drum side treatment process which provides a copper foil where the smooth drum side is provided with an adhesion enhancing plating and the other side is rough either or both sides being treated in accordance with the method of the invention. At a minimum, the drum side is treated with the adhesion promotion solution of the invention.

This invention further provides the following tree processes for treating a metal surface, particularly a copper or copper-alloy surface, as preferable embodiments One is a process of treating a metal surface having a step for forming a multi-layer printed wiring board comprising an inner-layer and an outer-layer, the inner-layer comprising at least one insulating layer and at least one conducting layer and the outer-layer comprising at least an insulating layer, in which the metal surface treated is a conducting layer. Second is a process for treating a metal surface having a step in which, after the adhesion promotion step, a polymeric material, such as a pre-preg layer, is placed directly adjacent to the conducting layer and the two layers adhered to one another in an adhesion step, forming a multi-layer printed circuit board. The third is a process for treating a metal surface having a step in which, after the adhesion promotion step, a polymeric photosensitive layer is placed directly adjacent to the conducting layer and the two layers adhered to one another in an adhesion step, forming a multi-layer printed circuit board.

After contact of the copper surface with the adhesion promoter to form the micro-roughened conversion coated surface, generally a pre-preg layer may be placed directly adjacent to the copper surface and the pre-preg layer adhered directly to the copper surface in the adhesion step thereby forming a multi-layer printed circuit board. Generally, in the adhesion step, heat is applied to initiate the adhesion reaction. In the adhesion step, mechanical bonding is believed to be due to penetration of the polymer of the insulating layer into the micro-roughened surface provided in the adhesion promotion step. As an alternative to the pre-preg layer, the polymeric material may be applied directly on top of the micro-roughened surface produced in the adhesion promotion step in the form of a polymeric photoresist, screen-resist solder mask or adhesive material.

As mentioned above, the present invention avoids the use of multi-step pretreatment processes which require additional steps between a microetch step and the subsequent printed circuit board manufacturing step in which a polymeric layer is applied to the copper, including alkali dips, oxide and reducer steps. In addition, the present invention avoids the use of surfactants. While not intending to be bound by theory, it is believed that such surfactants may migrate to the face of the coating interfering with the bond between the roughened surface and the polymeric coating. Also, such surfactants may cause excessive foaming during use of the roughening composition.

In use, it is often desirable to follow the adhesion promotion step with a rinse step, though it is often adequate to rinse just with water. The treated surface is subsequently dried. In accordance with a preferred embodiment of the process, a polymeric material is subsequently adhered to the micro-roughened surface with a single rinse and drying step.

A pre-preg insulating layer may be applied directly to the micro-roughened surface and in the adhesion step, pressure is also applied by placing the layers which are to form the multilayer laminate of the printed circuit board or at least the innerlayer and outerlayer, in a press. Where pressure is applied, it is generally within a range of from 100 to 400 psi, preferably within the range of from 150 to 300 psi. The temperature will generally be 100° C., and more often, from 120° C. to 200° C. The adhesion step is generally carried out for a period of from 5 minutes to 3 hours, most usually from 20 minutes to 1 hour, but is for sufficient time and pressure and at a sufficiently high temperature to ensure good adhesion between layers. During the adhesion step, the partially cured polymeric material of the insulating layers which is generally an epoxy resin, tends to soften and wet the treated copper surface, prior to further reacting to become fully crosslinked, ensuing that the conductive pattern in the metal is substantially sealed between insulating layers and subsequent penetration of water and air is avoided. If desired, several layers may be placed together in the adhesion step to effect lamination of several layers in a single step to form the multi-layered board.

As will be seen, the present invention provides a considerably simplified process over the known processes and provides a surface formed from copper or other metals which has good adhesion.

EXAMPLES

Examples of the invention are given below. In the examples, results were measured in terms of the color of the coating as a correlation exists between color and coating thickness. Lighter colored coatings such as pink to light brown indicate thin coatings that are operative but not optimum. Reddish brown to dark brown coatings are of more desirable thickness and are more robust to subsequent handling. Black coatings are excessive and powdery.

Examples 1 to 5

The following formulations were prepared:

| Example | Sulfuric acid (62 wt. %) [%] | Phosphoric acid (85 wt. %) [%] | Hydrogen peroxide (35 wt. %) [%] | Benzo-triazole [wt. %] | 1-hydroxy benzotriazole 1 hydrate [wt. %] |
| --- | --- | --- | --- | --- | --- |
| 1 | 6.4 | 1 | 2.5 | 0.4 | 0 |
| 2 | 6.4 | 1 | 2.5 | 0.3 | 0.1 |
| 3 | 6.4 | 1 | 2.5 | 0.2 | 0.2 |
| 4 | 6.4 | 1 | 2.5 | 0.1 | 0.3 |
| 5 | 6.4 | 1 | 2.5 | 0 | 0.4 | all examples 1 to 5 are diluted by pure water to total 1 liter

An epoxy innerlayer material was cleaned and dried and then treated with the above formulations by immersion for two minutes at a temperature of 35° C.

In Examples 1 and 5, pink to light brown conversion coatings are formed on the copper. In Examples 2 to 4, dark brown coatings are formed on the copper. Additionally, with respect to Examples 2 to 4, when the concentration of 1-hydroxy benzotriazole-1-hydrate is higher than the concentration of berzotriazole, the conversion coatings formed were darker ill color.

It is shown that the dark brown conversion coatings which are robust to subsequent handling may be obtained by the present compositions.

Examples 6 to 9

The following formulations were prepared:

| Example | Sulfuric acid (62 wt. %) [%] | Phosphoric acid (85 wt. %) [%] | Hydrogen peroxide (35 wt. %) [%] | Benzo-triazole [wt. %] | 1-hydroxy benzotriazole 1 hydrate [wt. %] |
| --- | --- | --- | --- | --- | --- |
| 6 | 6.4 | 0 | 2.5 | 0.2 | 0.2 |
| 7 | 6.4 | 0.5 | 2.5 | 0.2 | 0.2 |
| 8 | 6.4 | 1.0 | 2.5 | 0.2 | 0.2 |
| 9 | 6.4 | 1.5 | 2.5 | 0.2 | 0.2 | all example 6 to 9 are diluted by pure water to total 1 liter

An epoxy innerlayer material was cleaned and dried and then treated with the above formulations by immersion for two minutes at a temperature of 35° C. When the concentration of the phosphoric acid in the adhesion promotion composition is high, a lighter color coatings are formed on the copper. It is shown that the conversion coatings of various thicknesses maybe obtained depending upon the particular inorganic acid and the amount of such acid in the adhesion promoting composition.

Example 10

The following composition was

| | |
| --- | --- |
| Sulfuric acid (62 wt. %) | 6.4% |
| Phosphoric acid (85 wt. %) | 1.0% |
| Benzotriazole | 0.1% by weight |
| 1-hydroxy benzotriazole 1 hydrate | 0.3% by weight |
| Hydrogen peroxide (35 wt. %) | 2.5% |
| diluted by pure water to total 1 liter | |

An epoxy innerlayer material was cleaned and dried and then treated with the above composition by immersion for two minutes at a temperature of 35° C. A dark brown layer formed on the copper.

Example 11 (Comparative)

A conventional copper etching/adhesion promoting bath was prepared by combining 90 ml of sulfuric acid (50%), 35 ml of hydrogen peroxide (35%), 12–18 parts per million ("ppm") of tetrabutyl ammonium chloride, 9 g of benzotriazole and sufficient deionized ("DI") water to provide 1 L of bath. The bath was heated at 35° C.

A reverse treated copper foil was the immersed in the bath for 60 seconds. The foil was then removed from the bath and rinsed with DI water for 60 seconds and then dried. The foil was the laminated to NELCO 4000-2 resin in a WABASH press under 275 pounds per square inch ("psi") of pressure and a maximum temperature of 183° C. for 1 hour and 45 minutes. The foil was then peeled from the resin using an INSTRON instrument. An average peel strength of 5.7 pounds per inch ("lb./in.") was obtained.

Example 12

A copper etching/adhesion promoting bath according to the present invention was prepared by combining 90 ml of sulfuric acid (50%), 35 ml of hydrogen peroxide (35%), 12–18 parts per million ("ppm") of tetrabutyl ammonium chloride, 2.25 g of benzotriazole, 6.75 g of 1-hydroxybenzotrazole and sufficient DI water to provide 1 L of bath. The bath was heated at 35° C.

A reverse treated copper foil was the immersed in the bath for 60 seconds. The foil was then removed from the bath and rinsed with DI water for 60 seconds and then dried. The foil was then laminated to a NELCO 4000-2 resin in a WABASH press under 275 psi of pressure and a maximum temperature of 183° C. for 1 hour and 45 minutes The foil was then peeled from the resin using an INSTRON instrument. An average peel strength of 7.53 lb/in was obtained.

From these data it can be seen that the present invention provides adhesion promoted surfaces having high peel strengths.

Example 13 (Comparative)

A copper etching/adhesion promoting bath according to the present invention was prepared by combining 90 ml of sulfuric acid (50%), 35 ml of hydrogen peroxide (35%), 10 ml of phosphoric acid (85%), 6.8 g of benzotriazole and sufficient DI water to provide 1 L of bath. The bath was heated at 35° C.

A reverse treated copper foil was the immersed in the bath for 60 seconds. The foil was then removed from the bath and rinsed with DI water for 60 seconds and then dried. The foil was ten laminated to a NELCO 4000-2 resin in a WABASH press under 275 psi of pressure and a maximum temperature of 183° C. for 1 hour and 45 minutes. The foil was then peeled from the resin using an INSTRON instrument. An average peel strength of 5.91 lb/in was obtained.

Example 14

A copper etching/adhesion promoting bath according to the present invention was prepared by combining 90 ml of sulfuric acid (50%), 35 ml of hydrogen peroxide (35%), 10 ml of phosphoric acid (85%), 1.7 g of benzotriazole, 5.1 g of 1-hydroxybenzotriazole and sufficient DI water to provide 1 L of bath. The bath was heated at 35° C.

A reverse treated copper foil was the immersed in the bath for 60 seconds. The foil was then removed from the bath and rinsed with DI water for 60 seconds and then dried The foil was then laminated to a NELCO 4000-2 resin in a WABASH press under 275 psi of pressure and a maximum temperature of 183° C. for 1 hour and 45 minutes. The foil was then peeled from the resin using au INSTRON instrument. An average peel strength of 8.3 lb/in was obtained.

Example 15

A copper etching/adhesion promoting bath according to the present invention was prepared by combining 90 ml of sulfuric acid. (50%), 35 ml of hydrogen peroxide (35%), 10 ml of phosphoric acid (85%), 4–16 parts per million ("ppm") of tetrabutyl ammonium chloride, 1.7 g of benzotriazole, 5.1 g of 1-hydroxybenzotriazole and sufficient DI water to provide 1 L of bath. The bath was heated at 35° C.

A reverse treated copper foil was the immersed in the bath for 60 seconds. The foil was then removed from the bath and rinsed with DI water for 60 seconds and then died. The foil was then laminated to a NECLO 4000-2 resin in a WABASH press under 275 psi of pressure and a maximum temperature of 183° C. for 1 hour and 45 minutes. The foil was then peeled from the resin using an INSTRON instrument and visually inspected for color. The results are reported in the following table.

| Chloride ion (ppm) | Peel Strength (lb/in) | Color |
|---|---|---|
| 0 | 7.629 | Chocolate Brown |
| 1 | 8.155 | Chocolate Brown |
| 2 | 8.259 | Chocolate Brown |
| 4 | 8.434 | Chocolate Brown |
| 8 | 7.453 | Chocolate Brown |
| 16 | 5.086 | Pink |

The above data clearly show that the present invention provides greatly improved peel strengths over conventional copper adhesion promoting baths. From these data, it can be seen up to 8 ppm of chloride ion results in increased peel strengths, At higher chloride ion concentrations, the peel strength is not improved and the color is unacceptably light.

Thus, by mixing at least two different corrosion inhibitors wherein at least one is a hydroxy-substituted azole compound, such as a mixture of benzotriazole and 1-hydroxybenzotriazole or its hydrate, increased peel strength are obtained. The mixture of such corrosion inhibitors can be anywhere from 50% benzotriazole and 50% 1-hydroxybenzotiazole to 10% benzotriazole and 90% 1-hydroxybenzotriazole, but preferably 25% benzotriazole and 75% 1-hydroxybenzotriazole. Additionally, the data show that compositions further comprising chloride ion provide increased peel strength. When such chloride ion is added, the amount of such ion is up to 8 ppm, preferably 6 ppm.

We claim:

1. An adhesion promotion composition comprising (1) from 0.01 to 20% by weight of hydrogen peroxide based on the weight of the composition, (2) a mixture of inorganic acids comprising sulfuric acid and phosphoric acid wherein the total amount of the inorganic acid is from 1 to 30% by weight based on the weight of the composition, and (3) at least two different azole compound corrosion inhibitors, wherein at least one corrosion inhibitor is an hydroxy-substituted azole compound and wherein the composition comprises up to 6 ppm of chloride ion.

2. The adhesion promotion composition of claim 1, wherein the hydrogen peroxide is present in the range from 0.1% to 20% by weight.

3. The adhesion promotion composition of claim 1, wherein the mixture of inorganic acids is the mixture of a major amount of sulfuric acid and a minor amount of phosphoric acid.

4. The adhesion promotion composition of claim 1, wherein the mixture of inorganic acids is present in an amount of from 1% to 30% by weight.

5. The adhesion promotion composition of claim 1, wherein the corrosion inhibitors are present in a weight ratio of 99:1 to 1:99.

6. The adhesion promotion composition of claim 1, wherein an amount of the corrosion inhibitors is in the range from 0.1% to 2% by weight, based on the total weight of the composition.

7. The adhesion promotion composition of claim 1 wherein the hydroxy-substituted azole is selected from the group consisting of hydroxy-substituted triazoles and hydroxy-substituted tetrazoles.

8. The adhesion promotion composition of claim 1 wherein at least one corrosion inhibitor is selected from the group consisting of triazoles, tetrazoles and imidazoles.

9. The adhesion promotion composition of claim 8 wherein the corrosion inhibitor is selected from the group consisting of triazole, tetrazole, benzotriazole, carboxybenzotriazole, chlorobenzotriazole and imidazole.

10. The adhesion promotion composition of claim 1, wherein said composition is free of surfactant.

11. A process for treating a metal surface comprising contact of the metal surface with the adhesion promotion composition of claim 1 to form a micro-roughened conversion coated surface.

12. The process of claim 11, where the metal is copper or copper alloy.

13. The process of claim 11, further comprising adhering a polymeric material to the micro-roughened conversion coated surface.

14. An adhesion promotion composition comprising (1) from 0.01 to 20% by weight of hydrogen peroxide based on the weight of the composition; (2) a mixture of inorganic acids comprising sulfuric acid and phosphoric acid wherein the total amount of inorganic acid is from 1 to 30% by weight based on the weight of the composition; and (3) a mixture of at least two different azole compound corrosion inhibitors comprising a first corrosion inhibitor selected from the group consisting of triazoles, tetrazoles, benzotriazoles, and imidazoles and a hydroxy-substituted azole compound as a second corrosion inhibitor, wherein the composition comprises up to 6 ppm of chloride ion.

15. An adhesion promotion composition comprising (1) from 0.01 to 20% by weight of hydrogen peroxide based on the weight of the composition; (2) a mixture of inorganic acids comprising sulfuric acid and phosphoric acid wherein the total amount of inorganic acid is from 1 to 30% by weight based on the weight of the composition; and (3) a mixture of at least two different azole compound corrosion inhibitors comprising a benzotriazole compound as a first corrosion inhibitor and hydroxy-substituted azole compound as a second corrosion inhibitor, wherein the composition comprises up to 6 ppm of chloride ion.

16. The adhesion promotion composition of claim 15 wherein the benzotriazole compound is selected from the group consisting of benzotriazole, carboxybenzotriazole and chlorobenzotriazole.

17. The adhesion promotion composition of claim 15 wherein the hydroxy-substituted azole compound is 1-hyrdoxybenzotriazole.

* * * * *